United States Patent [19]

Weinberg et al.

[11] Patent Number: 5,126,682
[45] Date of Patent: Jun. 30, 1992

[54] DEMODULATION METHOD AND APPARATUS INCORPORATING CHARGE COUPLED DEVICES

[75] Inventors: Aaron Weinberg, Potomac, Md.; Kenneth Cunningham, Sterling, Va.; Daniel Urban, Silver Spring, Md.

[73] Assignee: Stanford Telecommunications, Inc., Santa Clara, Calif.

[21] Appl. No.: 670,810

[22] Filed: Mar. 18, 1991

Related U.S. Application Data

[63] Continuation-in-part of Ser. No. 597,685, Oct. 16, 1990, abandoned.

[51] Int. Cl.⁵ ............................................. H03D 3/00
[52] U.S. Cl. ..................................... 329/304; 375/83; 375/85
[58] Field of Search ............... 329/304, 306, 310; 375/52, 53, 54, 55, 56, 57, 80, 83, 84, 85, 86, 87

[56] References Cited

U.S. PATENT DOCUMENTS 5,005,186 4/1991 Aono et al. ................... 329/304 X Primary Examiner—David Mis
Attorney, Agent, or Firm—Jim Zegeer

[57] ABSTRACT

A demodulator apparatus for demodulating a data bearing broadcast signal in the absence of mixers and without incurring quantization errors. The apparatus incorporates a receiver for receiving a broadcast signal and producing therefrom a predetermined intermediate carrier frequency ($F_{IF}$), transversal filter connected to receive the intermediate carrier frequency $F_{IF}$ has N active stages and tap weight means at each of said stages for entering a tap weight sequence to yield maximum correlation energy when desired alignment occurs to thereby make phase and frequency agreement between local timing and the received signal, and the frequency $F_{IF}$ is sampled at a clock rate ($F_s$) of:

$$F_s = \frac{4F_{IF}}{K}$$

wherein $F_{IF}$ is the intermediate frequency and K is a scaling factor which is related to the number of carrier cycles per stage, the transversal filter includes a charge coupled device having the N active stages.

6 Claims, 5 Drawing Sheets

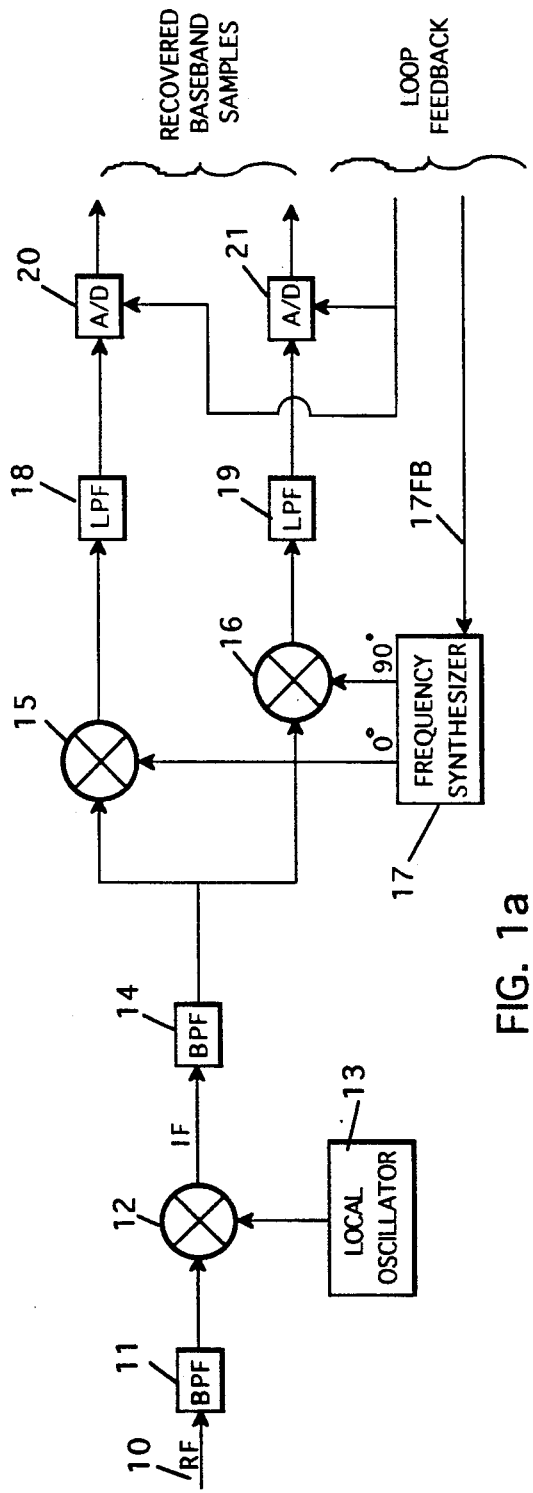
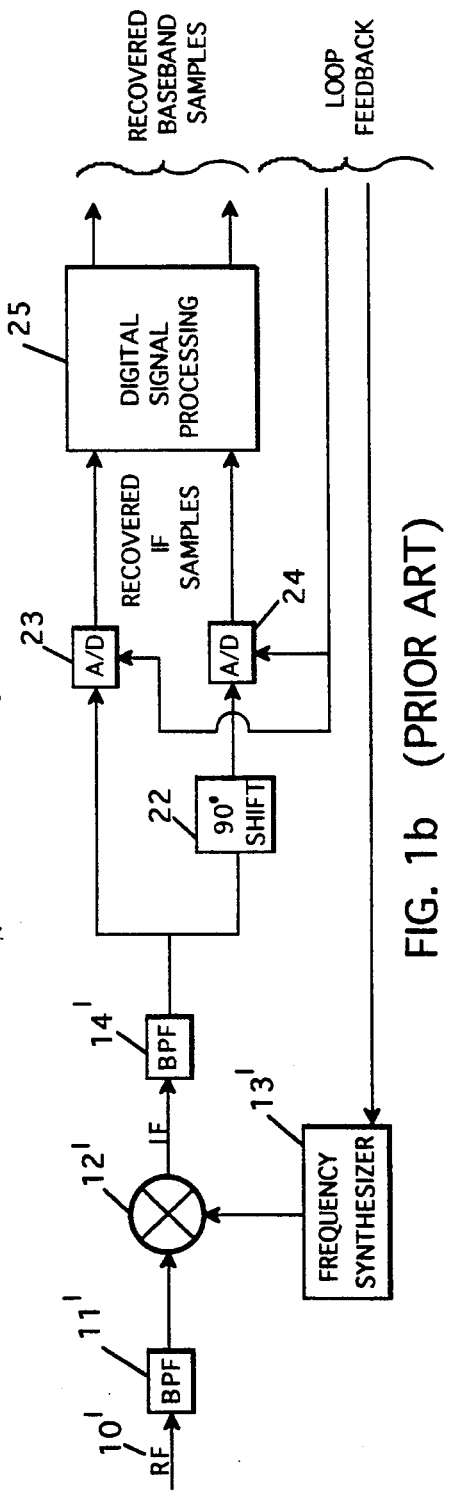
FIG. 1a (PRIOR ART)
FIG. 1b (PRIOR ART)

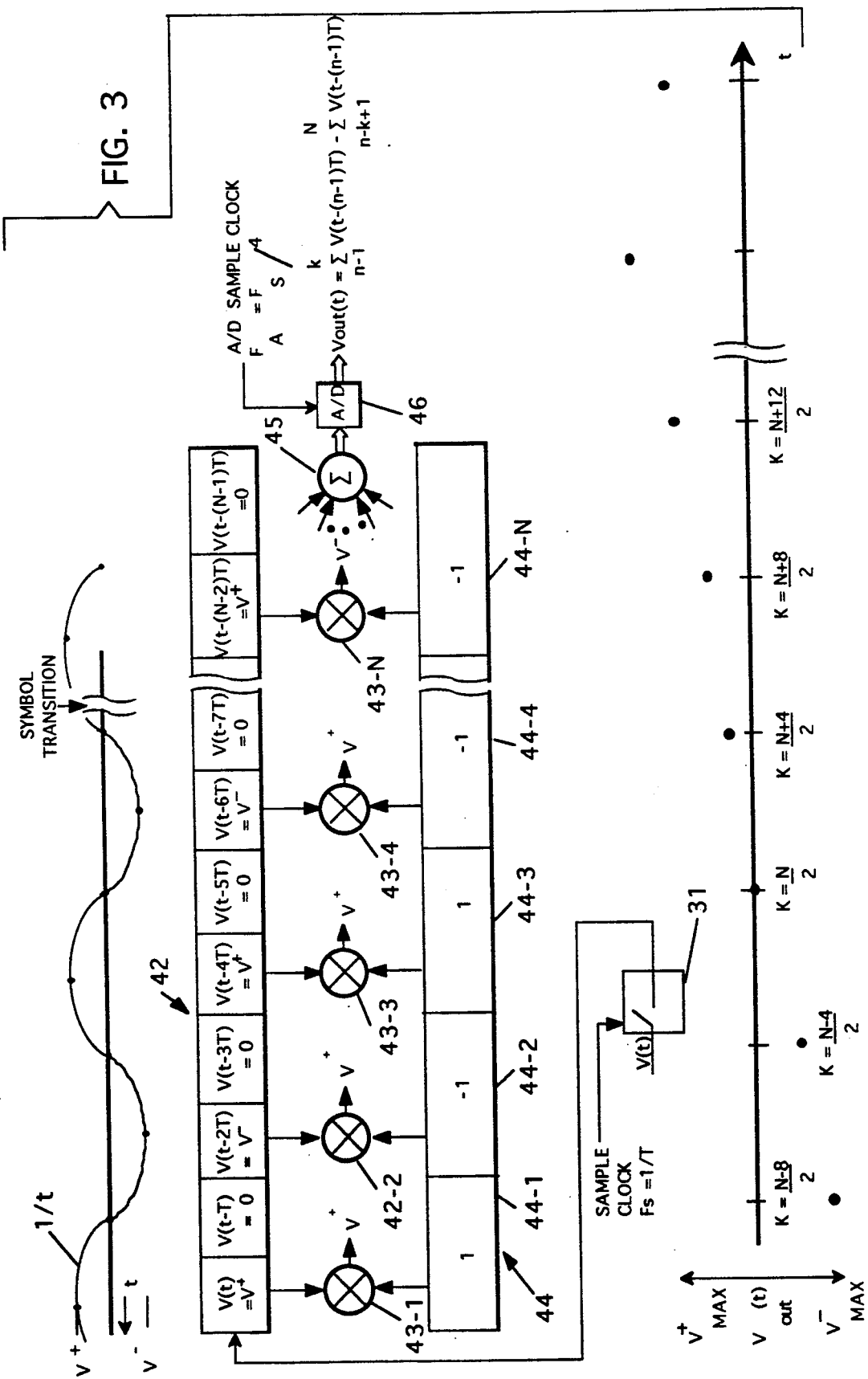

DEMODULATION METHOD AND APPARATUS INCORPORATING CHARGE COUPLED DEVICES

REFERENCE TO RELATED APPLICATION

This application is a continuation-in-part of U.S. patent application Ser. No. 07/597,685 filed Oct. 16, 1990 entitled "A DEMODULATION METHOD AND APPARATUS", now abandoned.

BACKGROUND AND BRIEF DESCRIPTION OF THE INVENTION

A basic component within any communication receiver is the demodulator. For digital communications one of two prior art demodulator design concepts is typically employed. The first approach requires translating the received signal to baseband while the second approach operates on the signal at some selected intermediate frequency (IF). Complexities and limitations in both approaches are evidence of the need for improved demodulation techniques.

Recent advances in charge-coupled-device (CCD) technology have spawned new concepts in a variety of technical areas. Application of this technology to issues facing the communications industry has resulted in the discovery of new solutions to problems in digital communications. The objective of this invention is to provide a new demodulation method and apparatus which offers a number of enhancements. The invention correlates time ordered samples of a received signal with a preselected tap weight sequence to yield maximum correlation energy when desired alignment occurs to thereby mark phase and frequency agreement between local timing and the received signal. In a preferred embodiment, the invention employs charge-coupled-device technology for demodulation. Benefits over traditional approaches, including improved performance and reduced complexity, are realized by this invention. The benefits of a CCD based demodulation approach over traditional methods are presented in the following sections.

Several aspects of this invention provide enhancements over traditional methods. Some of these areas of enhancement include performance, implementation, reliability, cost, size and power consumption. The following is a summary of some of the more prominent features of this invention:

I. MATCHED FILTERING of IF SIGNALS

Wide bandwidth A/D converters are required by IF demodulation to extract signal samples. The samples must be processed with high speed accumulators in order to perform the required integration operations. These factors combine to produce a system high in cost, power consumption and size. CCD based demodulation, according to this invention, performs the filter task in a single low power device. Many additions are done simultaneously in parallel prior to the A/D thereby eliminating a substantial portion of the digital accumulation process. Since the accumulations are performed with analog signals prior to sampling, quantization error is reduced. In the preferred embodiment, digitization occurs after the CCD processing thereby reducing the required A/D bandwidth relative to IF demodulation.

II. QUADRATURE CHANNEL FORMATION

There are two principal approaches to generating quadrature samples. The first leverages the sample sequence generated in a single channel with alternate stages tapped and multiplied by select tap weights. In this case, both positive and negative inphase and quadrature phase samples are generated. The samples are separated in time by the CCD clock period, $T_s$, and can be collected using a single or multiple A/D's and sorted as desired. The second approach follows a more conventional plan by using two channels (one I and one Q) whose inputs are offset in phase by a 90 degree shifter. While similar to the IF sampling method, this offers some enhancement since it is possible to work at relatively high frequency levels where phase shifters are linear over very wide ranges. Because of this, it may be possible to avoid designs with multiple shifters over wide bandwidths.

III GAIN AND PHASE DISTORTION MITIGATION

Distortion of signals passed through independent channels is due to imperfections in the components comprising the chains. The generation of I and Q samples from phased CCD outputs presents the option of limiting the demodulator to one channel, hence introducing common distortion to both I and Q. Relative phase and amplitude characteristics are thereby preserved. Demodulation using two channels however, is still improved over conventional techniques, when dual transversal filters are fabricated in the same monolithic device. Similarities in physical characteristics are maintained between the channels when they are both embedded in the same device.

IV. FREQUENCY SYNTHESIS SIMPLIFICATION

A typical approach to demodulator design is to translate received signals to a fixed IF frequency. This forces the frequency synthesizer to span the allocated transmission band of the desired signal in order to translate it to the target frequency. In the case of coherent reception, the synthesizer must also be phase continuous over this span. This new demodulation concept instead permits simple reconfiguration of the circuitry for each change in tuning, thus allowing it to process at select frequencies spread throughout the band. It is therefore possible to divide the desired span into regions containing an acceptable IF setting. The frequency synthesizer must then be capable of spanning only the frequency range of the widest defined region.

V. DC BIAS AVOIDANCE

Baseband demodulation translates the received signal to low frequencies centered around zero hertz (DC). During the demodulation process, imperfections in mixer technology introduce DC bias signals independent of the mixed signal content. The mixer bias combines with the desired signal causing distortion. Since the CCD approach does not require a signal translation to baseband, it avoids this type of bias distortion.

VI. SIMPLIFIED DSP SUPPORT

This demodulation technique has digital signal processing computational loading characteristics comparable to baseband demodulation. This results in simpler lower speed operation relative to IF demodulation where the bulk of the demodulation process is placed on the digital signal processor. Requirements for complicated windowing and computation are also avoided.

VII. PSEUDO NOISE (PN) DESPREADING AND FREQUENCY DEHOPPING

Characteristics of CCD transversal filters are very compatible with two common signal processing techniques, PN spreading and frequency hopping. Real-time tap weight programmability provides the CCD with a means for directly despreading a received PN coded signal. The robust frequency characteristics of the CCD permit the dehopping of signals over very wide bands with use of a simple synthesizer operating over a much narrower range. Both of these capabilities provide implementation enhancements over more traditional methods.

VIII LOWERED COST

High manufacturing yields for CCD transversal filters indicate that low cost production is possible. This coupled with inherent design simplification leads to an overall reduction in size, component count and complexity. All of this results in cost savings relative to competing techniques.

IX. IMPROVED FLEXIBILITY AND RELIABILITY

The CCD is an analog device which is controlled digitally. This results in an element which is easily configured for a variety of cases. It replaces or relieves burden typically placed on supporting demodulator elements thus lowering overall component count. This leads to improved reliability as the number of items in the demodulator is reduced.

BRIEF DESCRIPTION OF THE DRAWINGS

The above and other objects, advantages and features of the invention will become more apparent when considered with the following specifications and accompanying drawings wherein:

FIG. 1a is a block diagram of a prior art baseband demodulator for a fixed QPSK symbol rate, FIG. 1b is a block diagram of a prior art IF demodulator for a fixed QPSK symbol rate, FIG. 3 is a diagrammatic illustration of analog signal processing according to the invention using a commercially available charge-coupled-device (CCD)

DETAILED DESCRIPTION OF THE INVENTION

Figure 2:
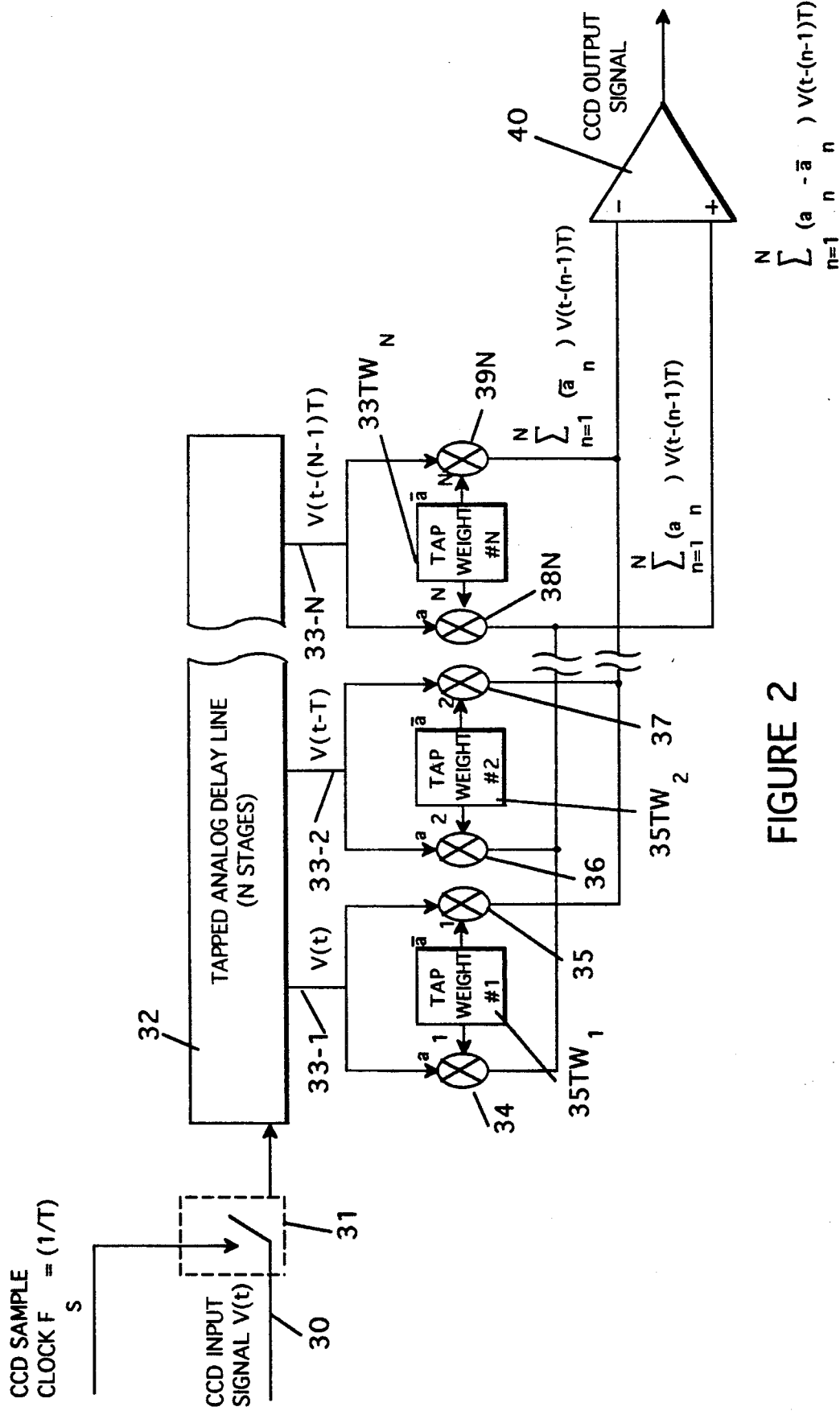
FIG. 2 is a block diagram of a charge-coupled-device implemented as a transversal filter.

Coherent demodulation of digital PSK communications signals has traditionally been accomplished in two ways; baseband (FIG. 1a) and IF demodulation (FIG. 1b). Both techniques present designers with a number of issues which must be considered before pursuing a detailed design. Typical concerns include performance limitations, size/power restrictions, cost impacts and overall complexity.

Although advances in digital signal processing (DSP) have reduced demodulator design dependency on analog circuits, some basic, and necessary analog components remain. Unfortunately, many of these components have features which are undesirable in communication applications. For example, filters tend to be large and have bandwidth/attenuation limitations. Mixers tend to add unwanted DC biases into the recovered signal. Synthesizers must be phase continuous and tunable over the targeted frequency range. These and many other implementation issues continually challenge designers. FIGS. 1a and 1b illustrate the two traditional approaches for a simple single data rate demodulation application. Of interest is the fact that even these simple cases contain the problem areas noted above. From this, one can infer the complications incurred when additional features such as Pseudo Noise (PN) despreading, frequency dehopping, or data rate adjustability are added.

Referring to FIG. 1a, the RF signal input on line 10 is filtered in filter 11, mixed in mixer 12 with a local oscillator 13 signal or to produce an IF signal which, in turn, is filtered in filter 14. This IF signal is applied to a pair of mixers 15 and 16 which receive inputs from frequency synthesizer 17, which maintains phase coherency under control of feedback signals on 17FB. A pair of low pass filters 18 and 19 provide the quadrature signals to a pair of analog-to-digital converters 20 and 21, respectively, which then supply the recovered baseband samples to a utilization device (not shown).

Examination of the baseband demodulation case illustrated in FIG. 1a reveals the minimum functionality needed to demodulate a QPSK signal using this technique. First, phase coherent frequency synthesis is required over the desired carrier uncertainty span. For large tuning ranges (e.g., a 40 MHz transponder bandwidth), this requirement can become a major cost factor. Next, two mixers 15 and 16 are needed to translate the IF signal to baseband inphase (I) and quadrature phase (Q) channels. Since the received signal is centered at baseband following the mixing operation, attention must be given to the mixer induced. Once the signal has been demodulated, filters 18 and 19 must be provided which are matched to the data rate(s) of interest. In demodulators with multiple data rate capabilities, complex filter or integrator schemes must be developed. Finally, amplitude and phase imbalance between the I and Q chains must, in some way, be compensated. In summary, this approach presents many problems that manifest themselves in the form of implementation losses and size/cost complications. However, the simplicity of this approach has, in the past, made it the most viable alternative.

Referring to the prior art IF demodulation approach shown in FIG. 1b, filter 11,, mixer 12' and filter 14' perform the same function as they do in FIG. 1a. Frequency synthesizer 13', is maintained phase coherent by a feedback loop. The IF signal is supplied to 90 degree shifter 22 in the quadrature channel and then to A/D converter 24 while the inphase channel is provided to A/D converter 23. Digitized recovered IF samples are then supplied to digital signal processor 25 which passes the recovered baseband samples to a utilization device (not shown).

The use of IF demodulation has expanded in more recent years as high speed digital signal processing technology has evolved. Benefits of this include avoidance of DC bias errors and reduction in the number of mixers. Filter concerns are restricted to aliasing prevention since digital signal processing can perform the matched filter operations. While mitigating many problems associated with baseband demodulation, this technique is still troubled by many undesirable features.

Digital matched filtering incurs quantizing errors and the A/Ds used to extract the information must have high input bandwidths and sampling rates. Gain and phase imbalances between channels must also be addressed. While DSP circuitry 25 has matured at a fast pace, excessively high speed devices may be required, in some cases, to employ this approach. Finally, the need remains for a synthesizer 13' which is phase coherent over the entire tuning range.

Many reliable communications systems have been fielded using these two demodulation techniques. Engineering creativity and ingenuity have overcome many design obstacles. Unfortunately, much of this has been done on a case by case basis. While the above discussion is not intended to be fully comprehensive nor applicable to every demodulation case, it is provided to demonstrate the problems that designers face with the above prior art approaches and help illustrate the merits of this invention.

THE PRESENT INVENTION

CCD technology has been applied to a variety of endeavors in recent years; video probably being the most notable. As the technology has matured, new CCD components with improved features have emerged. For example, efforts by government and industry have resulted in the development of transversal filter devices employing CCD technology. The new demodulation concept of this invention is based on this form of the technology.

The following is a basic description of the CCD transversal filter. The filter architecture presented is representative of a family of configurations which could be employed. This particular filter design is an example and presented for illustration and is not intended to restrict or limit the scope of the invention. Typically the filter's design is influenced by many factors specific to a given application and these factors must be considered prior to selecting a particular architecture.

Referring to FIG. 2, the CCD transversal filter is a tapped analog delay line 32, made up of a string of capacitive storage elements (stages), which acts as an analog shift register. Each stage is capable of holding a charge corresponding to a time delayed sample value taken at the filter input. The analog samples from sampler 31 are shifted along the delay line at each CCD clock cycle. The delay line 32 is likened to a "bucket brigade", passing charge from one stage to the next with each cycle of the clock. Parallel to the delay line is a set of registers $33TW_1, 33TW_2 \ldots 33TW_n$ containing tap weights. The charge at each stage is multiplied in multipliers 34, 36 . . . 38N by its corresponding tap weight. The resulting products are then summed as indicated to form the filter output. The weight values govern the filter response characteristics and therefore must be selected judiciously.

Products of both the tap weight and its complement are used in the filter implementation. The complements are multiplied in multipliers 35, 37 . . . 39N and summed as indicated. This permits summation to be performed by a differential op amp 40. Once the sampled values are multiplied by their proper tap weights and the results summed through the op amp 40, they are emitted as the filter output.

Table 1 lists some of the features of the Lincoln Labs 4-ABC CCD transversal filter:

TABLE 1

WIDE INPUT BANDWIDTH ~ 100 MHz
HIGH SAMPLING RATE ~ 40 MHz
WIDE DYNAMIC RANGE ≧ 60 dB
ANALOG AMPLITUDE (NO QUANTIZING)
PROGRAMMABLE TAP WEIGHTS
4 CCD CORRELATORS PER CHIP
   2 INDEPENDENT DEMODULATORS
   POSSIBLE VIA A SINGLE CHIP
HIGH YIELD DURING PRODUCTION ≧ 80%
   LOW-COST PRODUCTION POTENTIAL

Wide operating ranges in bandwidth, sampling rate and dynamic range make its application to a variety of situations possible. The CCD's use of analog samples provides enhanced performance over digital sampling techniques by reducing amplitude quantizing errors and power consumption. This particular device supports tap weight programming and contains multiple channels to add to its versatility. While other transversal filter devices are available from various sources, this particular example is used to demonstrate the current state-of-the-art.

DEMODULATION ACCORDING TO THIS INVENTION

Central to the demodulation technique of this invention is the correlation of time ordered samples of a received signal with a preselected tap weight sequence 44-1, 44-2 . . . 44-N, thereby yielding maximum correlation energy when desired alignment occurs. This maximum correlation or "peak" marks phase and frequency agreement between local timing and the received signal. In its preferred embodiment it is implemented with a CCD transversal filter 42 although use of digitized VLSI filters are possible. Consider the case when every other filter stage is tapped and the tap weights alternate between values of 1 and −1. FIG. 3 illustrates a transversal filter 42 configured in this manner. Above the filter 42 is a sinusoidal signal, v(t), that has been PSK modulated by a simple square wave whose period is equal to twice that of the entire CCD filter. (The symbol rate to CCD period is variable. This particular case has been selected for convenience of illustration. Each square wave cycle represents two consecutive symbols with opposite polarities.) Note that the depicted sinusoid has been positioned so that its amplitude extremes align with the filter taps thereby producing the maximum possible correlation value. This alignment is representative of that which occurs on every fourth cycle of the CCD clock during the coherent demodulation process for a select carrier frequency. Coherent tracking maintains this relationship subject to noise and loop characteristics.

During demodulation, nominal clock rates are established within the receiver and an appropriate IF frequency is selected. Proper loop processing then forces the received sinusoid to converge with the tap weights 44-1, 44-2 . . . 44-N as depicted in FIG. 3. Once this convergence has occurred, the resulting CCD output from summer 45, sampled at the A/D converter 46 at one-fourth the CCD clock rate, consists of the demodulated baseband data having passed through a matched filter. The signal sequence drawn below the filter 42 in FIG. 3 represents the resulting output as the modulated signal passes through the transversal filter 42. Note that the sequence is triangular in shape. This corresponds to the expected signature of match filtered baseband data when the amplitude polarities of consecutive symbols alternate and the symbol period is the same as that of the filter.

It is important to observe the demodulation steps that occur through this correlation process. First, the signal is demodulated resulting in the recovery of the baseband data from an intermediate carrier frequency. This is accomplished without the use of mixers (as would be required with baseband demodulation) and without incurring quantization errors (as would happened with conventional IF sampling). The step to baseband also serves to reduce DSP rates relative to IF demodulation techniques given that only a small fraction of the CCD output need be processed. The CCD also acts as the symbol matched filter. Hence a number of functions are performed simultaneously within the CCD.

In order to configure the CCD to operate as described above, certain relationships must be established. First, proper selection of an IF carrier is required. For the case of alternating 1 and -1 tap weights with every other register tapped, the equation relating IF frequency ($F_{if}$) to CCD configuration is:

$$F_{if} = (N_{stage}/4)(D_r/2)(K)(1/\alpha)$$

The term $N_{stage}$ corresponds to the length of the CCD; the number of active CCD stages. Since it is desired to configure the CCD in such a way as to generate output samples separated in phase by 90 degrees, the CCD is partitioned into an integer number of four stage blocks. This balances the sequence of samples generated by the CCD permitting periodic sampling of its output. The terms $D_r/2$ and $\alpha$ define the relationship between the CCD length and the symbol rate of a received QPSK signal. The symbol rate, $D_r$, is defined for QPSK modulation and is divided by 2 to get a single channel rate. The term $\alpha$ denotes the portion of a symbol that the CCD spans; $\alpha$ is equal to 2 when the CCD spans one-half of a symbol. Finally, K serves as a scaling factor which when used in conjunction with the other terms, allows the selection of different IF carrier frequencies while maintaining the filters matching characteristics. This factor specifies the number of carrier cycles per four stage block and it is an odd integer $\geq 1$.

Once the IF frequency is selected, the CCD sample clock is determined by the equation:

$$F_s = (4F_{if})/K = (N_{stage})(D_r/2)(1/\alpha)$$

By clocking the CCD at 4/K times the IF frequency, four phases of the received signal are sampled. The phases are in 90 degree steps and are repetitively sequenced. These four sample sequences represent the positive and negative inphase components and the positive and negative quadrature components of the received signal. Hence, it is possible to advantageously extract both the I and Q samples of a signal from a single channel with corresponding samples separated in time by $T_s$ (i.e., $1/F_s$).

Once the IF is established, it is possible to calculate the frequency of aliasing components that additional external filtering must mitigate. Two types of aliasing are of primary concern. First, there are potentially other carriers in the spectrum that are multiples of K and $F_{if}$. Luckily, these frequencies are usually rather distant from the desired carrier and bound $F_{if}$ at one-third to three times the desired IF. Mitigation of these components is rather straightforward. The second source of aliasing is from adjacent channels. Since the CCD has a sin(x)/x filter characteristic for alternating 1 and -1 tap weights, its roll off is insufficient to fully attenuate powerful signals in adjacent channels. If further isolation is needed, it may be obtained by additional narrow band filtering. Such filtering can be done on the analog signal prior to the CCD 42 or through digital processing after the A/D converter 46. It is also possible to improve the CCD's filter characteristics through use of different tap weights. This can be accomplished with devices employing multibit tap weights or by using ternary weight state CCD's in parallel, with their outputs scaled and summed.

The three steps presented above are summarized in Table 2:

TABLE 2

DESIGN CONSIDERATIONS AND EQUATIONS

• DESIRED IF CARRIER $$F_{IF} = \left(\frac{N_{STAGE}}{4}\right)\left(\frac{D_R}{2}\right)\left(\frac{K}{\alpha}\right)$$

WHERE:
$N_{STAGE}/4$ = NUMBER OF CCD STAGES (0–128 IN STEPS OF 4) DIVIDE BY 4
$D_R/2$ = QPSK SYMBOL RATE DIVIDE BY 2

$$\alpha = \begin{cases} 1: \text{CCD SPANS 1 SYMBOL PERIOD} \\ 2: \text{CCD SPANS } \frac{1}{2} \text{ SYMBOL PERIOD} \\ 4: \text{CCD SPANS } \frac{1}{4} \text{ SYMBOL PERIOD} \end{cases}$$

$$K = \begin{cases} 1: \text{4 STAGES/CARRIER CYCLE} \\ 3: \text{4 STAGES/3 CARRIER CYCLES} \\ 5: \text{4 STAGES/5 CARRIER CYCLES} \end{cases}$$

• CCD CLOCK RATE SELECTION $$F_S = \frac{4F_{IF}}{K} = \frac{N_{STAGE}D_R}{2\alpha}$$

• CCD DEMOD ALIASING FREQUENCIES FOR A DESIRED SIGNAL AT $F_{IF}$ $F_{ALSN+1} = 5F_{IF}$
$F_{ALSN} = 3F_{IF}$
$F_{ALSN-1} = \frac{1}{3}F_{IF}$
$F_{ALSN-2} = 1/5F_{IF}$ A methodical design procedure first requires identification of acceptable IF frequencies. These frequencies are a function of the data rate, the CCD length and two proportionally factors, $\alpha$ and K. The term $\alpha$ determines the relationship between the symbol time and the CCD length, while K defines the ratio of carrier frequency to CCD length. Once the carriers are selected, it is possible to determine the correct CCD clock rates. Finally, the aliasing frequencies must be considered so as to permit selection of the proper band pass filtering.

Figure 4A:
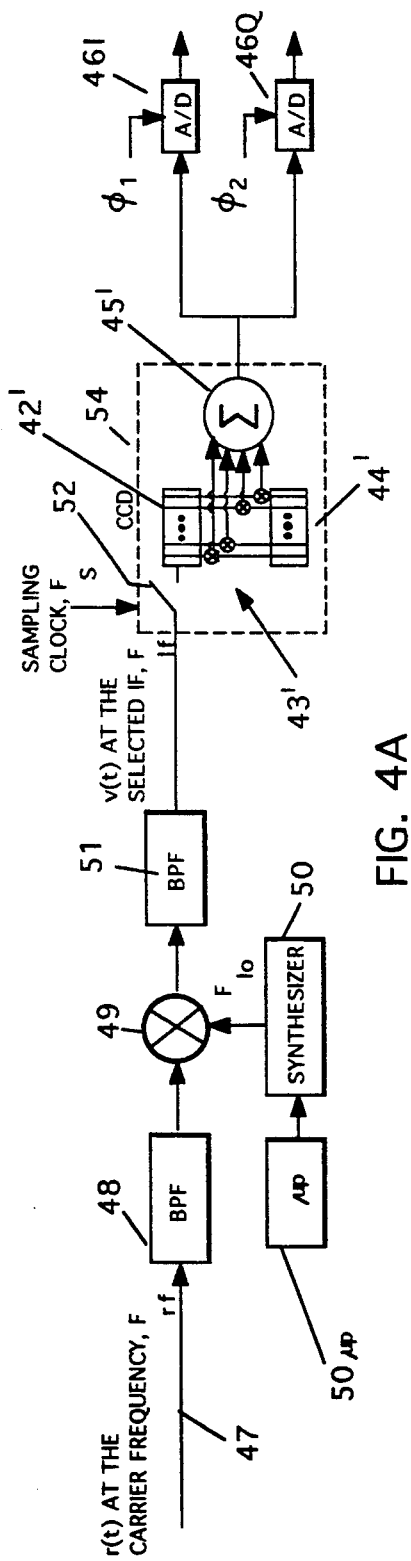
FIGS. 4a and 4b are diagrammatic illustrations of the demodulation according to this invention as performed with the CCD.
Figure 4B:
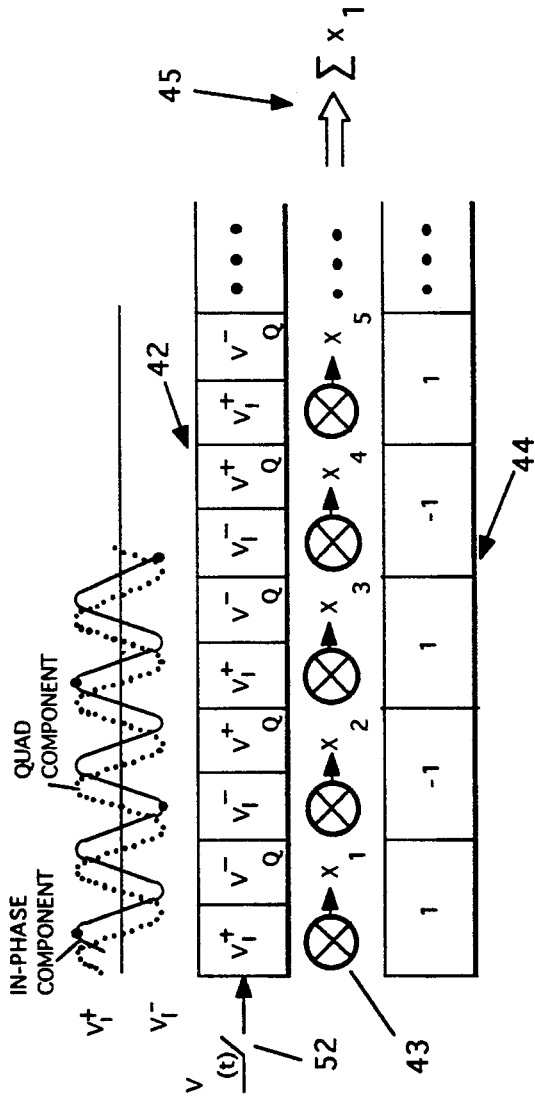

For further illustration, consider the case of a QPSK signal, r(t). This signal is injected into a demodulator as shown in FIGS. 4a and 4b. This signal on line 47 is bandpass filtered in BPF filter 48 and mixed in mixer 49 with a local signal $F_{LO}$ from frequency synthesizer 50 which has its phase and frequency controlled or bumped by a microprocessor 50 MP. In the acquisition phase it operates as an open loop system and in the tracking phase it operates as a closed loop system. Bandpass filter 51 passes the selected IF ($F_{IF}$) to sampler 52 which functions in a fashion similar to sampler 31 of FIGS. 2 and 3. The depicted demodulator 53 uses a CCD and tap weight unit 54 which is configured according to the relationships described above. Synthesizer 50 settings are such that r(t) is translated to the proper IF frequency. The frequency, $F_{lo}$, is simply the difference in the received frequency $F_{rf}$ and the desired IF frequency $F_{if}$. Since $F_{if}$ can be set to different values within a certain targeted span, the local oscillator frequency from synthesizer 50 need only tune over the range required to get from one acceptable $F_{if}$ value to another. This implies that the frequency span in which r(t) is found may be larger than the synthesizer span; an attractive aspect.

Another feature of this invention is the use of a single circuitry chain to demodulate both inphase (I) and quadrature phase (Q) signals. This approach eliminates analog phase and amplitude imbalances found when using two separate chains. Care must be taken when using this technique to insure that the CCD is clocked at a sufficiently high rate, so as to minimize offsets in the I and Q samples resulting from non-simultaneous sampling.

It is of course possible to use this invention with independent I and Q channels on dual CCD's thereby permitting simultaneous I and Q sampling. Some reduction in gain and phase imbalance can also be achieved with this variation, given that the CCD's are part of a single, dual channel, monlithic chip.

Once the translated and filtered signal, v(t), is passed into the CCD, it is sampled and, according to the tap weights, match filtered. Since the CCD acts as a filter, requirements for analog filtering prior to the CCD depend on the targeted operational environment. Given potential for adjacent channel interference, the filtering requirements can be quite stringent.

Figure 5:
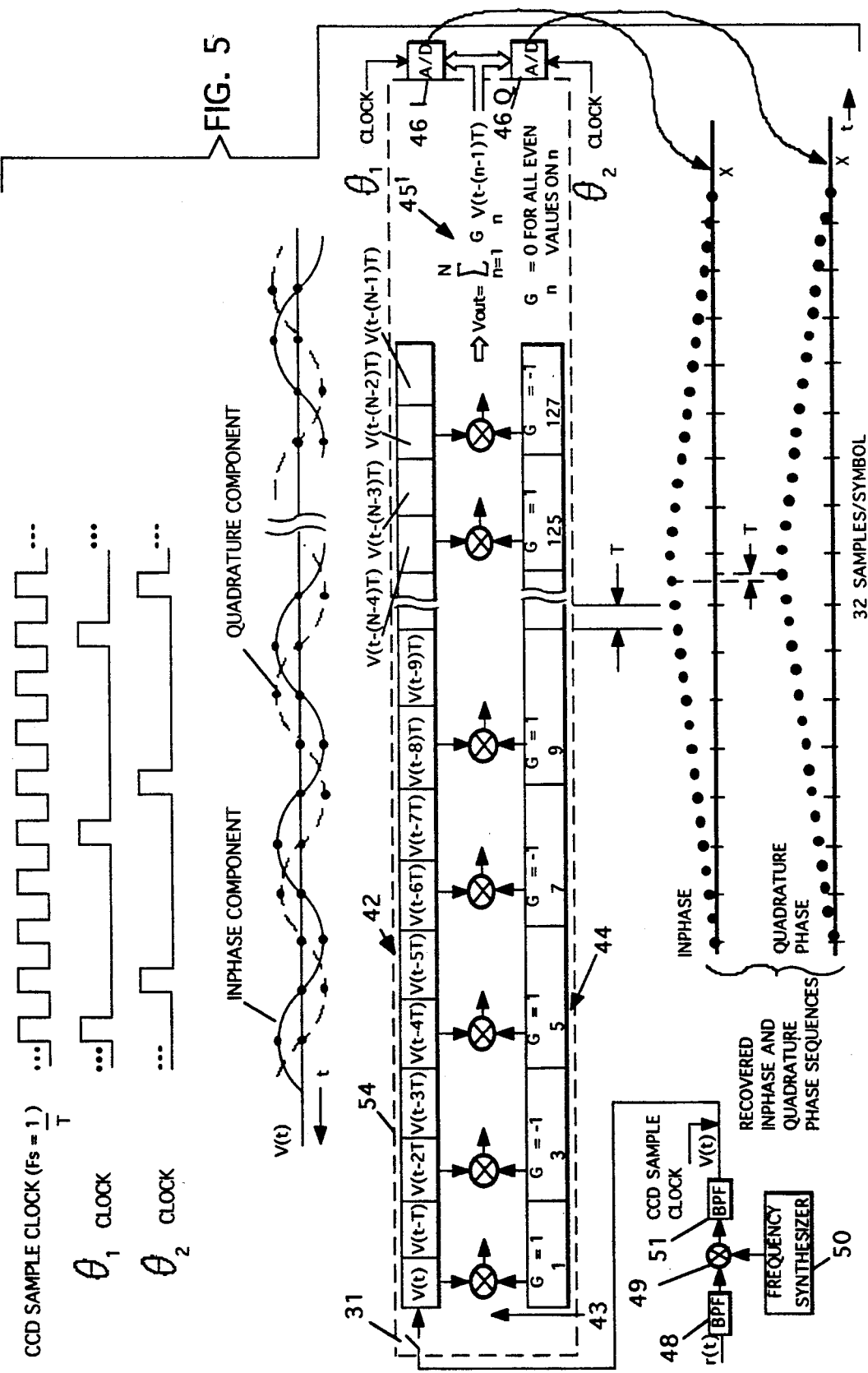
FIG. 5 is a further diagrammatic illustration of a QPSK demodulator using CCD technology.

The CCD output cycles through four phases of the signal providing interleaved inphase and quadrature samples with alternating signs. This is diagrammatically illustrated by the "in-phase" and "quad" components shown in FIG. 4b. By repeatedly examining the CCD output on any one phase of the CCD clock, an information sequence for that phase is extracted. For BPSK and QPSK symbols, the use of two A/D's is optional as it is possible to extract both I and Q samples with a single device given proper input bandwidth, sample clocking and output sorting. The waveforms shown above in FIG. 5 diagrammatically illustrate the timing for this case when the symbol period is equal to the CCD length.

ADVANTAGES OF THE INVENTION

Having described the mechanics of the CCD demodulator according to this invention, many of its benefits become self-evident. The CCD technique retains all the positive features of the IF sampling and adds performance margins, while eliminating many of its limitations. Instantaneous parallel multiplication and accumulation is performed on the analog signal. This reduces the amount of digital processing required after A/D conversion, while lowering amplitude quantization errors and implementation losses. Amplitude and phase imbalances are mitigated by use of a single chain, rather than two dedicated chains, to extract I and Q samples. This also reduces component count in the demodulator. The CCD's large input bandwidth (the bandwidth can be extended with wide band sample and hold circuits if desired or necessary) and high sampling rate enables performance at high frequencies, while eliminating the need for expensive wide bandwidth A/D converters. The processing capabilities of the CCD also reduce the sweep range needed from the local oscillator, again reducing costs. Programmable tap weights and clocking controls permit simple demodulator configuration for a variety of symbol rates and modulation types. Tap weight selection coupled with external filtering mitigates aliasing contributions from undesired signals outside the information bandwidth. Low power consumption and minor heat dissipation are also characteristic of this approach. Because of these benefits, it is apparent that use of the CCD reduces demodulator design complexity while enhancing performance, making its application attractive for use in ground installations, on board air and spacecraft and aboard vessels at sea.

The above description has relied heavily on examples and configurations that present a simplistic viewpoint for many issues. This generalization has been done to emphasize the broad aspects of the invention and avoid overly restricting the conceptual scope thereof.

There exist several caveats, options, or variations to the invention as discussed above. These involve variations in configuration and operation of the CCD and its supporting elements. Performance enhancement and increased flexibility are achievable with these options under certain circumstances.

Since there are several values of $F_{if}$ to which the demodulator input can be set, it is possible to relax the local frequency synthesizer range. Given that tuning is desired for a wide band, the band can be broken up into regions with each region containing an acceptable $F_{if}$ value. The synthesizer then needs tuning capability only over the widest of these regions. For example, in the case of a 40 MHz wide transponder, it is possible to design a demodulator using this concept that can tune to frequencies over this range, but with a much narrower synthesizer (e.g., 10 MHz).

Extraction of the quadrature component is an essential part of the coherent demodulation process. CCD demodulation permits this to be accomplished in a variety of ways. Conventional techniques in which the signal is passed through a phase shifter still apply as does the use of a quadrature LO with a mixer. While both can be done prior to count, a more complex or elegant approach is the use of the quadrature component that is generated as a by-product in the inphase extraction process. Since the I and Q samples are not taken simultaneously with this approach, it is possible to incur small offset errors. These errors are dependent on the CCD sampling rate relative to the IF and the difference between the local and received frequency bases. Given that sampling rate and frequency synchronization are acceptable, it is possible to then collect the I and Q samples in two ways. The first involves extracting adjacent I and Q samples as they become available. This minimizes time between samples but requires two timing clocks (one for I and one for Q). The other way is to set the number of 4-stage blocks to an odd integer value and to then use a single periodic clock to take symmetrically spaced I and Q samples. Either of these approaches can improve demodulator design by avoiding dual channel distortion and lowering component count.

A basic configuration parameter is the number of stages employed by the CCD. In cases where the register length is fixed or affects CCD performance, it is possible to implement length control using two CCD channels. This is done by first aligning the tap weights in the two channels over the desired portion of the CCD length. Then, set the amplitude and polarities of the remaining tap weights so that they are complements of one another. Passing the same signal through both channels and then summing the resulting outputs will produce the effect of a shortened CCD. Hence the undesired output portions cancel each other when summed.

Another feature which is economically handled by the CCD is PN despreading. This is accomplished by using the local PN coder to generate the CCD tap weights thus implementing a PN chip matched filter. By employing this technique, it is possible to both despread and demodulate the signal simultaneously. Frequency dehopping may also be accommodated with the use of changeable tap weights or multiple CCD's.

The CCD observation window may be varied in size over virtually any fraction of a symbol period. Tracking loop requirements dictate that the length be one symbol or less. For many applications the optimal length may indeed by a very small fraction of a symbol period. This is a design feature that must be considered on a case by case basis.

The disclosed preferred embodiment of the invention is centered around use of the charge-coupled-device transversal filter. However, advances in digital design are resulting in digital transversal filters (placing the A/D before the filter). While the CCD holds an advantage at this time in clocking rate, bandwidth and quantization, much of the innovative concept is equally applicable for the digitally implemented case and may be used accordingly in practicing the broader aspects of the invention.

It is to be understood that the invention has been described in terms of specific embodiments and that modifications and adaptations may be made therein without departing from the true scope and spirit of the invention as defined by the following claims

What is claimed is:

1. Demodulator apparatus for demodulating a data bearing broadcast signal, comprising means for receiving a broadcast signal and producing therefrom a predetermined intermediate carrier frequency having analog signals therein, a charge coupled device connected to receive said intermediate carrier frequency and having N active stages and tap weight means at each of said stages for entering a tap weight sequence to yield maximum correlation energy when a predetermined alignment occurs to thereby mark phase and frequency agreement between local timing signals and the received signals.

2. Demodulator apparatus as defined in claim 1 including an analog-to-digital converter connected to said charge coupled device for digitizing analog signals after passing through said charge coupled device.

3. Demodulator apparatus for demodulating a data bearing broadcast signal in the absence of mixers and without incurring quantization errors, comprising:
   a) means for receiving a broadcast signal and producing therefrom a predetermined intermediate carrier frequency ($F_{IF}$),
   b) charge coupled device connected to receive said intermediate carrier frequency $F_{IF}$ and having N active stages and tap weight means at each of said stages for entering a tap weight sequence to yield maximum correlation energy when desired alignment occurs to thereby mark phase and frequency agreement between local timing and the received signal, and the frequency $F_{IF}$ is:

$$(N_{stage}/4)(D_R/2)(K)(1/\alpha)$$

where:
   $N_{stage}$ correspond to the number of active stages,
   $D_R/2$ and $\alpha$ defines the relationship between the number of active stages and symbol rate of the received signal,
   $K_1$ is a scaling factor which specifies the number of carrier cycles per four stage block and it is and odd integer $\geq 1$,
   $\alpha$ denotes the portion of a symbol, that said transversal charge coupled device spans,
   c) means for sampling said intermediate frequency at a clock rate ($F_s$) of:

$$F_s = \frac{4F_{IF}}{K}$$

wherein $F_{IF}$ is said intermediate frequency and K is a scaling factor which is related to the number of carrier cycles per stage.

4. The demodulator apparatus defined in claim 3 wherein said transversal filter is a charge coupled device having N stages having demodulator aliasing frequencies $F_{ALS}$ and said carrier frequency $F_{IF}$ is:

$$F_{IF} = \left(\frac{N_{STAGE}}{4}\right)\left(\frac{D_R}{2}\right)\left(\frac{K}{\alpha}\right)$$

where:
$N_{STAGE}/4$ = NUMBER OF CCD STAGES (0-128 IN STEPS OF 4) DIVIDE BY 4
$D_R/2$ = QPSK SYMBOL RATE DIVIDE BY 2

$$\alpha = \begin{cases} 1: \text{CCD SPANS 1 SYMBOL PERIOD} \\ 2: \text{CCD SPANS } \frac{1}{2} \text{ SYMBOL PERIOD} \\ 4: \text{CCD SPANS } \frac{1}{4} \text{ SYMBOL PERIOD} \end{cases}$$

.
.
.

$$K = \begin{cases} 1: 4 \text{ STAGES/CARRIER CYCLE} \\ 3: 4 \text{ STAGES/3 CARRIER CYCLES} \\ 5: 4 \text{ STAGES/5 CARRIER CYCLES} \end{cases}$$

.
.
.

CLOCK RATE SELECTION $f_s$ is $$\frac{4F_{IF}}{K} = \frac{N_{STAGE}D_R}{2\alpha}$$

-continued

AND SAID DEMODULATOR ALIASING
FREQUENCIES $F_{ALS}$ FOR A
DESIRED SIGNAL AT $F_{IF}$ IS $F_{ALS_{N+1}} = 5F_{IF}$
$F_{ALS_N} = 3F_{IF}$
$F_{ALS_{N-1}} = \frac{1}{3}F_{IF}$
$F_{ALS_{N-2}} = 1/5F_{IF}$ 5. A method for demodulating a data bearing broadcast signal in the absence of mixers and without incurring quantization errors, comprising:
  a) receiving a broadcast signal and producing therefrom an intermediate carrier frequency ($F_{IF}$),
  b) providing a charge coupled device (CCD) having N active stages and tap weight means at each of said stages for entering a tap weight sequence to yield maximum correlation energy when desired alignment occurs to thereby mark phase and frequency agreement between local timing and the received signal, and the frequency of $F_{IF}$ is:

$(N_{stage}/4)(D_R/2)(K)(1/\alpha)$ where:
  $N_{stage}$ correspond to the number of active stages,
  $D_R/2$ and $\alpha$ defines the relationship between the number of active stages and symbol rate of the received signal,
  $K_1$ is a scaling factor which specifies the number of carrier cycles per four stage block and it is and odd integer $\geq 1$,
  $\alpha$ denotes the portion of a symbol that said transversal filter spans,
  c) sampling said intermediate frequency at a clock rate ($F_s$) of:

$$F_s = \frac{4F_{IF}}{K_2}$$

wherein $F_{IF}$ is said intermediate frequency and $K_2$ is a scaling factor related to the number of carrier cycles per stage.

6. The method defined in claim 5 wherein said charge coupled device (CCD) having N stages has a demodulation aliasing frequency $F_{ALS}$ and said carrier frequency $F_{IF}$ is:

$$F_{IF} = \left(\frac{N_{STAGE}}{4}\right)\left(\frac{D_R}{2}\right)\left(\frac{K}{\alpha}\right)$$

where:
$N_{STAGE}/4$ = NUMBER OF CCD STAGES (0-128 IN STEPS OF 4) DIVIDE BY 4
$D_R/2$ = QPSK SYMBOL RATE DIVIDE BY 2

$$\alpha = \begin{cases} 1: \text{CCD SPANS 1 SYMBOL PERIOD} \\ 2: \text{CCD SPANS } \frac{1}{2} \text{ SYMBOL PERIOD} \\ 4: \text{CCD SPANS } \frac{1}{4} \text{ SYMBOL PERIOD} \end{cases}$$

$$K = \begin{cases} 1: 4 \text{ STAGES/CARRIER CYCLE} \\ 3: 4 \text{ STAGES/3 CARRIER CYCLES} \\ 5: 4 \text{ STAGES/5 CARRIER CYCLES} \end{cases}$$

CLOCK RATE SELECTION $f_s$ is $$\frac{4F_{IF}}{K} = \frac{N_{STAGE}D_R}{2\alpha}$$

AND SAID DEMODULATOR ALIASING
FREQUENCIES $F_{ALS}$ FOR A
DESIRED SIGNAL AT $F_{IF}$ IS $F_{ALS_{N+1}} = 5F_{IF}$
$F_{ALS_N} = 3F_{IF}$
$F_{ALS_{N-1}} = \frac{1}{3}F_{IF}$
$F_{ALS_{N-2}} = 1/5F_{IF}$

* * * * *